United States Patent [19]
Hazen et al.

[11] Patent Number: 5,594,686
[45] Date of Patent: Jan. 14, 1997

[54] METHOD AND APPARATUS FOR PROTECTING DATA STORED IN FLASH MEMORY

[75] Inventors: Peter K. Hazen, Auburn, Calif.; Michael J. Castillo, Provo, Utah

[73] Assignee: Intel Corporation, Santa Clara, Calif.

[21] Appl. No.: 578,175

[22] Filed: Dec. 29, 1995

[51] Int. Cl.$^6$ ................................................ G11C 11/34
[52] U.S. Cl. .................... 365/185.04; 365/185.33; 365/226; 365/228
[58] Field of Search .............. 365/185.04, 185.33, 365/226, 228

[56] References Cited

U.S. PATENT DOCUMENTS

| | | |
|---|---|---|
| 4,975,883 | 12/1990 | Baker et al. ........................ 365/226 |
| 5,509,134 | 4/1996 | Fandrich et al. .................... 365/185.33 |

*Primary Examiner*—David C. Nelms
*Assistant Examiner*—Trong Phan
*Attorney, Agent, or Firm*—Blakely, Sokoloff, Taylor & Zafman

[57] ABSTRACT

A method and apparatus for protecting data stored in a nonvolatile memory. First, a locking signal is initiated to indicate to the memory that write and erase operations are to be prevented. Next, in response to this locking signal, the supply voltage that supports write and erase operations in the memory is lowered below a threshold value. In doing so, protection circuitry that is contained within the memory prevents write and erase operations in the memory.

20 Claims, 3 Drawing Sheets

METHOD AND APPARATUS FOR PROTECTING DATA STORED IN FLASH MEMORY

FIELD OF THE INVENTION

The present invention relates to integrated circuit memories and more particularly to a method for preventing the loss of data stored in a nonvolatile memory.

BACKGROUND OF THE INVENTION

Nonvolatile memory is used by electronic equipment to store data. Data stored within nonvolatile memory is retained even when power to the electronic equipment is cut off. Therefore, nonvolatile memories are typically used in applications in which the user requires that data survive power interruptions to the electronic equipment or power interruptions to the memory itself, such as during physical transfer of a memory device from one piece of computer equipment to another. For example, it is been found useful to store data necessary to boot up a computer system in a nonvolatile memory inside the computer so that the data will always be available to the computer each time a user turns it on. For another example, a standard memory card contains a nonvolatile memory that allows a user to store data on the memory card at a first computer and then access the data using a second computer into which the memory card is subsequently inserted.

There are many types of nonvolatile memory storage devices, the most popular of which is the electrically programmable read only memory (EPROM). Another type of nonvolatile memory is the electrically programmable and electrically erasable read only memory (EEPROM) that was developed to erase and to rewrite the data contained in the memory on a byte-by-byte basis. More recently, a new category of nonvolatile memories has emerged known as flash EEPROMs. In a flash memory, an entire array of data, called a block of data, is simultaneously erased. Although a flash memory is capable of storing relatively large amounts of data in comparison to other nonvolatile memories, flash also exhibits several disadvantages as well.

For example, flash memories have been found to be vulnerable to inadvertent write and erase operations. During a write operation, a flash memory is programmed by storing the desired data in the device. The flash memory is erased in blocks. Once data has been stored in a flash memory by a series of write operations, the data may be read from the flash memory any number of times without incident. Software bugs or computer glitches have been known to inadvertently corrupt data contained within a flash memory, however, by accidentally causing computer data to be written over or erased. In addition, when a computer system to which a flash memory is coupled is turned on, off, or is reset, the supply voltage to the memory fluctuates. For example, a flash device may be inadvertently placed in a write or erase mode, particularly during power-up or power-down, when system control signals are indeterminate, making the flash device susceptible to data corruption.

To protect the data stored within a nonvolatile memory from these and other modes of corruption, protection circuitry is designed into the memory. This protection circuitry, shuts off or "locks out" access to the memory during periods of vulnerability. For example, one type of protection circuit is coupled to particular control pins of the memory such that when a particular signal generated by the computer system is registered by these pins, the protection circuit inside the memory places one or more blocks into lockout mode, thereby preventing all write and erase operations to these memory blocks. By preventing all write and erase operations during lockout, inadvertent write and erase operations, that would corrupt the integrity of the data, are avoided. Another type of protection circuit contained within a memory is coupled to one or more voltage supply input pins of the device. This type of protection circuit measures the supply voltage to the memory and places one or more memory blocks of the device into lockout mode when the supply voltage fluctuates during power-up and power-down of the computer system. In doing so, data corruption and device destruction is avoided.

Unfortunately, these various protection circuits can occupy a substantial amount of space within a memory, space that could otherwise be used to store data. In addition, the extra pins associated with various protection circuits increase the overall size and complexity of the memory. As a result, protection circuits and their associated control pins increase the cost and reduce the storage capacity of nonvolatile memories.

SUMMARY OF THE INVENTION

An object of the invention is to provide a method for protecting the data stored in a memory without significantly increasing the cost of the memory itself.

Another object of the invention is to provide a method for protecting the data stored in a memory during power-up and power-down conditions.

A method and apparatus for protecting data stored in a nonvolatile memory is described. First, a locking signal is initiated to indicate to the memory that write and erase operations are to be prevented. Next, in response to this locking signal, the supply voltage that supports write and erase operations in the memory is lowered below a threshold value. In doing so, protection circuitry that is contained within the memory prevents write and erase operations in the memory.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION OF THE PREFERRED EMBODIMENTS

A method and apparatus for protecting data stored in a nonvolatile memory is described in which the protection circuitry inherent in memories is better used, eliminating the need for incorporating additional protection circuits and their associated control pins into the memory. In general, the supply voltage coupled to a $V_{pp}$ voltage supply input pin of a memory is controlled or intercepted by control circuitry external to the memory. The control circuitry accepts a LOCKALL# control signal as input, and based upon a logical value of the LOCKALL# signal, the control circuit modulates the $V_{pp}$ output supply voltage to the memory.

The $V_{pp}$ supply voltage output of the control circuit is coupled to a $V_{pp}$ voltage supply input pin of the memory. Inside the memory, the voltage supply input pin is coupled to a protection circuit that disables write and erase operations to the memory when $V_{pp}$ falls below a threshold value. Therefore, while LOCKALL# remains unasserted, the control circuit keeps the $V_{pp}$ supply voltage high. The memory then uses this high $V_{pp}$ voltage to execute write and erase operations to its memory array. When LOCKALL# is asserted, however, the control circuit lowers $V_{pp}$ below the threshold value, thereby causing the protection circuit within the memory to engage. By engaging this protection circuit, the memory is placed into lockout mode, thereby preventing write and erase operations to the memory array within the device.

Supply voltage control circuits along with other supply voltage control techniques that are capable of modulating the voltage at a voltage supply input pin of a memory are described in more detail below. By modulating the supply voltage in this manner, the inherent internal protection circuitry coupled to the voltage supply input pin of the memory is selectively engaged to provide protection for the data stored in the memory.

Most flash memories accept two different voltage supply inputs, $V_{cc}$ and $V_{pp}$. The $V_{cc}$ supply voltage is coupled to a $V_{cc}$ voltage supply input pin of the flash memory and supports read operations in the memory. A $V_{pp}$ supply voltage is coupled to a $V_{pp}$ voltage supply input pin of the flash memory and supports write and erase operations in the memory. The nominal $V_{cc}$ supply voltage for most devices is typically 5 volts. The nominal $V_{pp}$ supply voltage for flash memories is typically either 5 volts or 12 volts.

Figure 1:
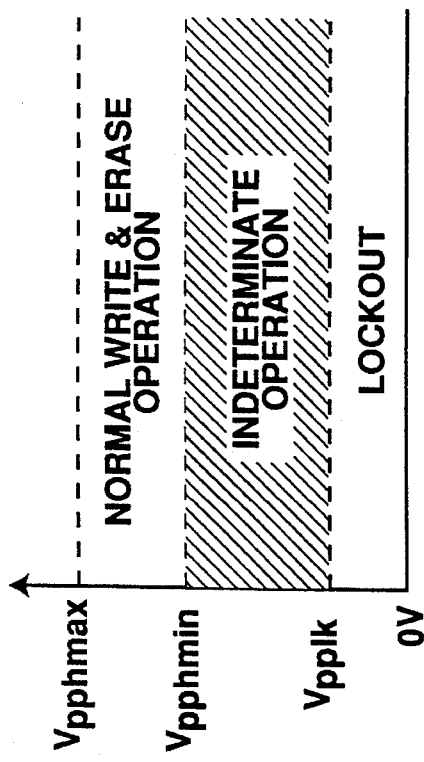
FIG. 1 is a diagram showing the operating range of a flash memory.

FIG. 1 is a diagram showing the operating range of a flash memory. There are two $V_{pp}$ voltage ranges under which a flash memory predictably operates. The first range is between 0 volts (ground) and $V_{pplk}$. This range is designated as the "lockout" range in FIG. 1. Although $V_{pp}$ is within this range, the memory locks out write and erase operations. While $V_{pp}$ is within the range of 0 V to $V_{pplk}$, however, data stored within the memory can be read by a read operation that relies on $V_{cc}$ for power. Read operations remain unaffected by $V_{pp}$.

The second range of $V_{pp}$ supply voltages that enable operation of the flash memory is within the range between $V_{pphmin}$ and $V_{pphmax}$, designated as "normal write and erase operation" in the diagram of FIG. 1. While $V_{pp}$ is in this normal write and erase operational range, write and erase operations within the flash memory are supported. For one type of flash memory requiring a nominal $V_{pp}$ value of 12 volts, the normal write and erase operational range of $V_{pp}$ is plus or minus 5% of 12 volts (11.4 V to 12.6 V). For another type of flash memory that uses a nominal $V_{pp}$ value of 5 volts, the normal write and erase operational range of the device is plus or minus 10% of 5 volts (4.5 V to 5.5 V).

By effectively locking out write and erase operations to the memory when $V_{pp}$ is not within the narrow write and erase operational range, the memory is protected from data corruption. As discussed earlier, data corruption can occur when the supply voltage to the memory fluctuates during power-up and power-down conditions by, for example, inadvertently placing the device in a write or erase mode. By including protection circuitry in the memory that prevents write and erase operations when $V_{pp}$ falls below $V_{pplk}$ (lockout mode), the data stored within the memory is protected when a user turns on, off, or resets the computer system containing the memory.

By controlling the $V_{pp}$ supply voltage to a memory, the same protection circuitry that places the memory into lockout mode during power-up and power-down of the computer system is engaged during steady-state operation of the computer system.

Figure 2:
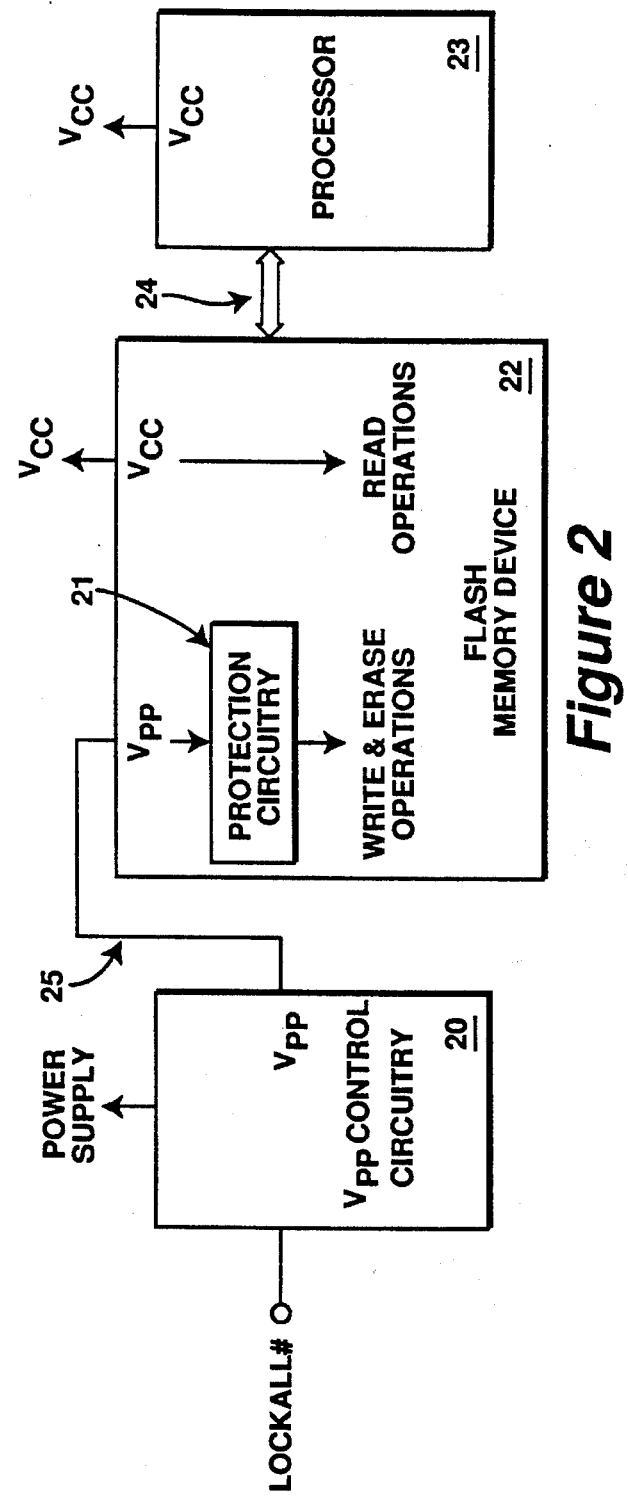
FIG. 2 is a block diagram of a computer system in accordance with an embodiment of the present invention.

FIG. 2 is a block diagram of a computer system in accordance with an embodiment of the present invention. $V_{pp}$ control circuitry 20, accepts a LOCKALL# signal as input, and in response, generates output voltage $V_{pp}$. The $V_{pp}$ output of control circuitry 20 is coupled to the $V_{pp}$ voltage supply input pin of flash memory 22 through voltage supply line 25. As shown, the $V_{pp}$ supply voltage is fed into protection circuitry 21 within the flash memory, and the protection circuitry either permits or prevents write and erase operations to the memory depending on the value of $V_{pp}$. Flash memory 22 is coupled to processor 23 through bus 24 which may comprise bridges, controllers, and other devices that aid in communication. Processor 23 communicates data and other information to and from flash memory 22 through bus 24. $V_{pp}$ control circuitry 20, flash memory 22 and processor 23 are all supplied by $V_{cc}$. As shown, $V_{cc}$ supports read operations separately from the write and erase operations supported by $V_{pp}$ within the flash memory.

After a computer system is switched on, and the voltage supply levels within the computer system have stabilized, the computer system is said to have entered steady-state operation. The steady-state mode of operation, continues while the computer system is in use until the computer is either reset or shut off, and the voltage supply levels within the computer system begin to drop off. It is during this steady-state operation time frame that methods in accordance with the present invention are implemented to protect data stored in a memory.

LOCKALL# is a logic level signal generated within the computer system which indicates whether or not write and erase operations in flash memory 22 are to be allowed. LOCKALL# is activated, or asserted, when it is at a logic low voltage level, and deactivated, or deasserted when placed at a logic high voltage level (usually $V_{cc}$). While LOCKALL# is deasserted, $V_{pp}$ control circuitry 20 keeps the $V_{pp}$ supply voltage to flash memory 22 within the normal write and erase operational range. As long as $V_{pp}$ is maintained within this range, protection circuitry 21 within the flash memory, will allow write and erase operations to occur. Under these conditions, for example, processor 23 will be permitted to write data to the memory for storage therein.

When LOCKALL# is asserted, it indicates that write and erase operations in flash memory 22 are to be prevented. In response to initiating LOCKALL#, $V_{pp}$ control circuitry 20 will lower the $V_{pp}$ supply voltage to the memory below the lockout voltage $V_{pplk}$. Once $V_{pp}$ is lowered below this threshold value, protection circuitry 21 will prevent write and erase operations from occurring. As a result, the data stored in the memory will be protected, and processor 23 will be unable to write data to the memory.

LOCKALL# is initiated by asserting a low logic level voltage (such as 0 V) for the description of embodiments of the present invention that follow. In other words, when LOCKALL# is at a low voltage level, this indicates that the associated memory is to be locked by preventing write and erase operations in the memory. The LOCKALL# signal is generated by a controller such as a memory controller or a more general microcontroller, or the LOCKALL# signal may be more directly generated by a switch within the computer system. For another embodiment, processor 23 generates the LOCKALL# signal. In accordance with an alternate embodiment of the present invention, the LOCKALL# signal is replaced by another signal that is initiated by asserting a high voltage. For this embodiment, the $V_{pp}$ control circuits that follow are appropriately modified.

Figure 3:
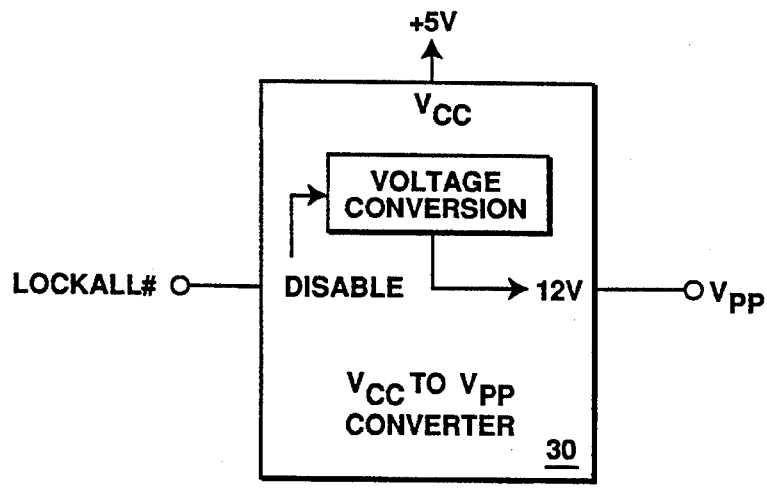
FIG. 3 shows an embodiment of the present invention in which a DC—DC converter is controlled.

FIG. 3 shows a $V_{pp}$ control circuit comprising a DC—DC converter incorporating disable circuitry. $V_{cc}$ to $V_{pp}$ converter 30 accepts the 5 V supply voltage and converts it to 12 V to generate $V_{pp}$. The LOCKALL# signal is coupled to a disable or shut down pin of converter 30. Many computer system designs use a DC—DC converter to supply 12 volts to $V_{pp}$. Because such converters typically have a disable or shut down pin that turns on and off the $V_{pp}$ voltage supply output, LOCKALL# is coupled directly to the disable input pin of converter 30 as shown. This embodiment of the present invention requires the incorporation of little or no additional circuitry to the computer system, thereby saving design time and production cost. For an alternate embodiment of the invention in which the DC—DC converter used to generate the $V_{pp}$ supply voltage does not have a disable pin, an external circuit is used to regulate the input voltage $V_{cc}$, thereby indirectly regulating $V_{pp}$.

Although the $V_{cc}$ to $V_{pp}$ converter solution offers a very cost-effective method to control $V_{pp}$, this solution is limited to cases in which the $V_{cc}$ to $V_{pp}$ converter provides a voltage supply exclusively to the flash memory. Otherwise, the $V_{pp}$ supply voltage will be shut down for all memories coupled to the converter, thereby placing each of these memories in lockout mode. Note that for another embodiment of the present invention, one may actually desire to place multiple flash memories in and out of lockout mode simultaneously. For this embodiment, the $V_{pp}$ output of the $V_{pp}$ control circuit of FIG. 3, and the figures that follow, are routed to multiple flash memories.

Figure 4:
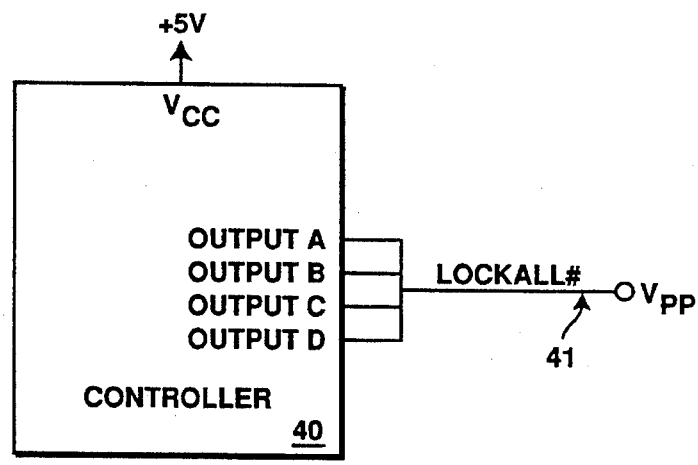
FIG. 4 shows an embodiment of the present invention in which a controller directly generates a supply voltage.

FIG. 4 shows an embodiment of the present invention in which the LOCKALL# signal generated on output line 41, is directly routed to $V_{pp}$. For this embodiment, controller 40 generates the LOCKALL# signal. As shown, the LOCKALL# signal is generated at outputs A, B, C, and D of controller 40. Because LOCKALL# must be able to drive the $V_{pp}$ source voltage under relatively high current conditions to support write and erase operations within the flash memory, outputs A, B, C, and D are coupled together as shown. In this manner, each of outputs A, B, C, and D of controller 40 need only supply ¼ of the current necessary to drive $V_{pp}$ during maximum power consumption by the flash memory.

Figure 5:
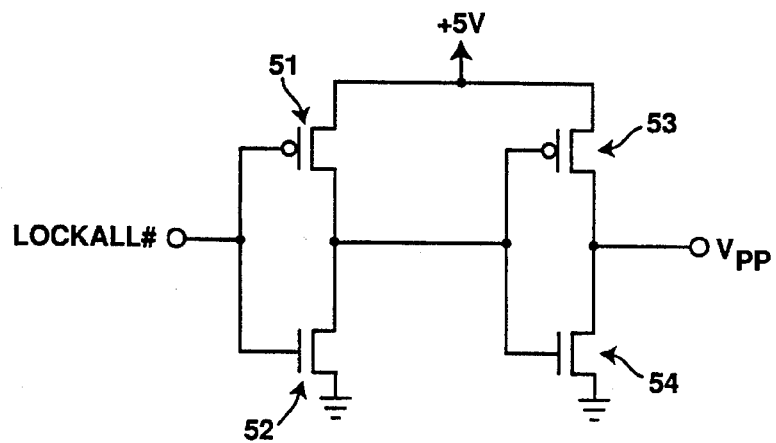
FIG. 5 shows a circuit in accordance with a first embodiment of the present invention.

FIG. 5 shows a portion of $V_{pp}$ control circuitry 20 in accordance with an embodiment of the present invention in which two inverters, coupled in series, are used to control the $V_{pp}$ supply voltage to flash memory 22 in response to the LOCKALL# signal. LOCKALL# is coupled to the gate of p-channel transistor 51 and the gate of n-channel transistor 52. The source of transistor 51 is coupled to a 5 volt power supply while the source of transistor 52 is coupled to ground. The drains of both transistors 51 and 52 are coupled to the gates of p-channel transistor 53 and n-channel transistor 54. The source of transistor 53 is coupled to a 12 or 5 volt power supply while the source of transistor 54 is coupled to ground. Output node $V_{pp}$ is coupled to the drains of transistors 53 and 54.

While LOCKALL# remains unasserted at a high logical voltage level, p-channel transistor 51 is turned off while n-channel transistor 52 is turned on. Turning off transistor 51 effectively isolates the power supply from the gates of transistors 53 and 54, while turning on transistor 52 effectively pulls the gates of transistors 53 and 54 down to ground. Grounding the gates of transistors 53 and 54 turns the transistors on and off respectively. Turning on p-channel transistor 53, pulls $V_{pp}$ up to the power supply voltage level. Meanwhile, because transistor 54 is off, the 0 volts coupled to its source will be effectively isolated from $V_{pp}$. As a result, $V_{pp}$ will achieve the nominal voltage level required to place flash memory 22 into the normal write and erase operational mode.

When the LOCKALL# signal is initiated by asserting a low voltage, write and erase operations to the associated memory are to be prevented. Asserting a logical low voltage level of approximately 0 volts to the gates of p-channel transistor 51 and n-channel transistor 52 will turn transistor 51 on and transistor 52 off. Turning transistor 51 on will have the effect of pulling the drain of transistor 51, which is coupled to the gates of transistors 53 and 54, up to the power supply voltage level. Meanwhile, turning transistor 52 off isolates the high voltage at the drain of transistor 52 from its grounded source. Pulling the gate of p-channel transistor 53 high will shut the transistor off, thereby isolating $V_{pp}$ at the drain of transistor 53 from the power supply at its source.

Meanwhile, because the high voltage applied to the gate of n-channel transistor 54 will turn the transistor on, any voltage residing on the $V_{pp}$ voltage supply line 25 will be drained through transistor 54 to ground, pulling $V_{pp}$ down below the threshold lockout voltage level of $V_{pplk}$. In doing so, the protection circuitry 21, internal to flash memory 22, will be engaged, forcing the memory into lockout mode and preventing write and erase operations in the memory. Therefore, according to the embodiment of FIG. 5, when LOCKALL# is initiated by asserting a low voltage level, data stored in flash memory 22 is protected by lowering $V_{pp}$ below the threshold value that engages the protection circuitry 21 inside the memory to prevent write and erase operations in the device.

In accordance with an embodiment of the present invention, transistors 51, 52, 53 and 54 are discrete components coupled together on a printed circuit board within a computer system. Although the implementation shown in FIG. 5 provides for very low operation current of the $V_{pp}$ control circuitry, it may also be a somewhat expensive implementation. The expense of the circuit of FIG. 5 stems from the fact that discrete transistors can be significantly more expensive than discrete resistors, and take up more space on a circuit board. In addition, the circuit of FIG. 5 cannot accommodate a 12 V supply voltage because the p-channel transistors cannot be fully operated by a 5 V gate voltage with 12 V coupled to the drain.

Figure 6:
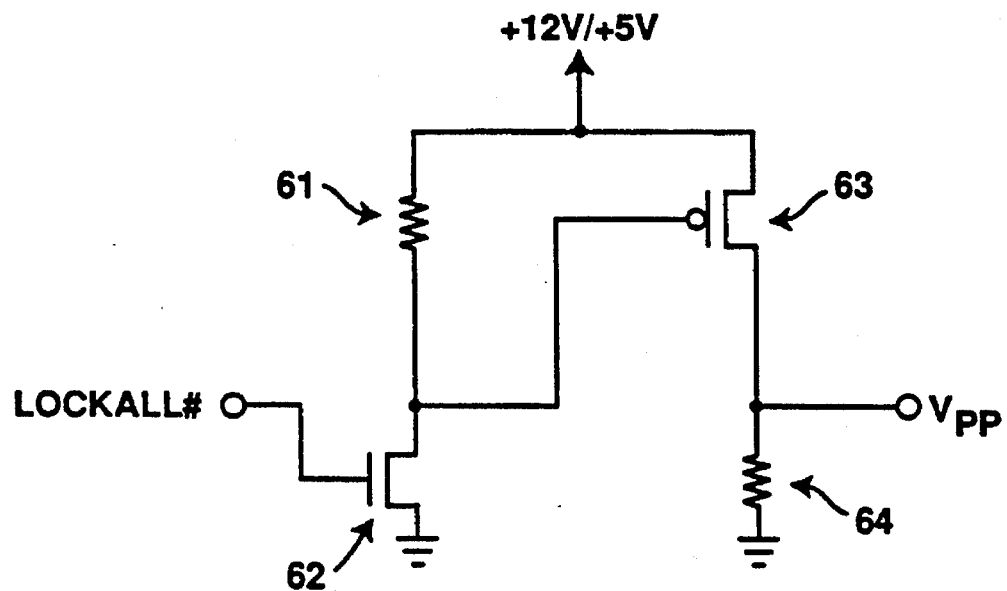
FIG. 6 shows a circuit in accordance with a second embodiment of the present invention.

FIG. 6 shows a portion of $V_{pp}$ control circuitry in accordance with another embodiment of the present invention in which transistors 51 and 54 of FIG. 5 are replaced with 10KΩ resistors 61 and 64. Although the circuit configuration of FIG. 6 draws a higher current from the power supply than the circuit of FIG. 5, by replacing two transistors with two resistors the circuit of FIG. 6 may be cheaper to implement as discrete components on a printed circuit board. In addition, the circuit of FIG. 6 can be accommodate a 12 V supply voltage as well as a 5 V supply. As shown, the LOCKALL# signal input is coupled directly to the gate of n-channel transistor 62. The source of transistor 62 is coupled to ground while its drain is coupled to both resistor 61 and the gate of p-channel transistor 63. The other node of resistor 61, along with the source of transistor 63, is coupled to the power supply. The output of the circuit, supply voltage $V_{pp}$, is coupled to the drain of transistor 63 and one node of resistor 64, while the other node of resistor 64 is coupled to ground.

When the LOCKALL# signal is deasserted at a high voltage, n-channel transistor 62 will turn on, lowering the resistance between the gate of transistor 63 and ground. Because the resistance of resistor 61 is high, approximately 10KΩ, while the source to drain resistance of transistor 62 is relatively minute, the voltage division between resistor 61 and transistor 62 will serve to pull the gate of transistor 63 down to 0 volts, thereby turning transistor 63 on. Turning on transistor 63 will effectively lower the resistance between its source and drain to an insignificant value in comparison to the relatively high 10KΩ resistance of resistor 64, thereby pulling the output $V_{pp}$ up to the power supply voltage. In doing so, $V_{pp}$ will reside within the normal write and erase operational range, permitting write and erase operations in flash memory 22 to occur.

When LOCKALL# is asserted at a low voltage, transistor 62 is shut off, raising its source to drain resistance, and allowing resistor 61 to then pull the voltage at the gate of transistor 63 up to the power supply voltage level. Placing a high voltage on the gate of transistor 63 will turn the transistor off raising its source to drain resistance, and allowing resistor 64 to pull $V_{pp}$ down to ground. In doing so, the $V_{pp}$ supply voltage to flash memory 22 is lowered below the lockout threshold voltage $V_{pplk}$ thereby engaging protection circuitry 21 to place the memory into lockout mode. This effectively prevents write and erase operations in the memory, protecting data stored in the memory from inadvertent corruption.

Figure 7:
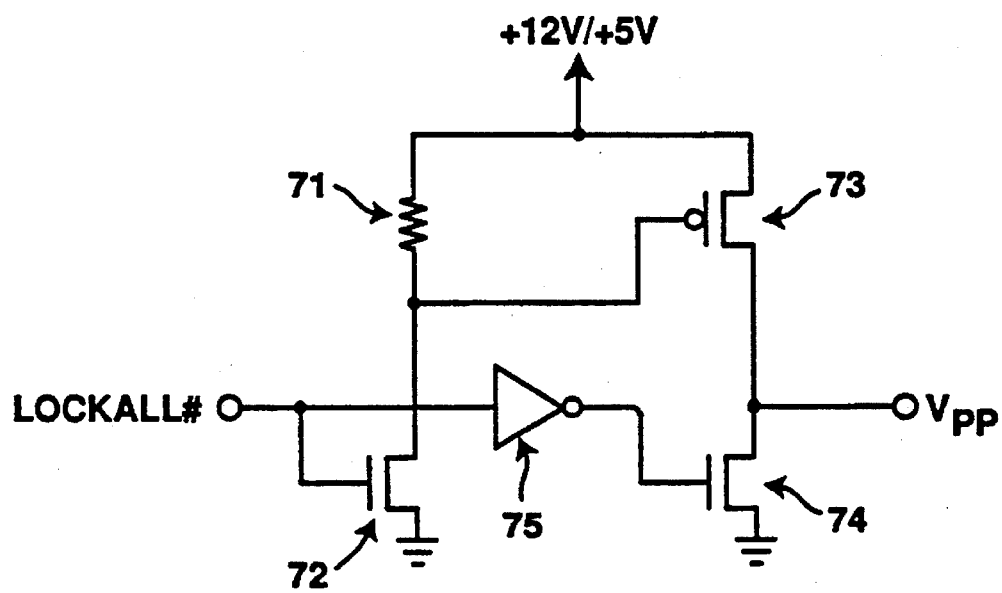
FIG. 7 shows a circuit in accordance with a third embodiment of the present invention.

FIG. 7 shows a circuit formed in accordance with an alternate embodiment of the present invention. The LOCKALL# input is coupled to the gate of n-channel transistor 72 and the input of inverter 75. The source of transistor 72 is coupled to ground while its drain is coupled to 10KΩ resistor 71. The output of inverter 75 is coupled to the gate of n-channel transistor 74, and the drain of transistor 72 is coupled to the gate of p-channel transistor 73. The power supply is coupled to resistor 71 and the source of transistor 73. The source of transistor 74 is coupled to ground while its drain is coupled to both the drain of transistor 73 and the $V_{pp}$ output node.

While LOCKALL# is unasserted, its voltage will be high, thereby turning on transistor 72 which will pull the gate of transistor 73 down to ground. Meanwhile, the relatively high resistance of resistor 71, will serve to isolate the power supply voltage from the gate of transistor 73. The output of inverter 75 will place a low voltage on the gate of transistor 74, turning it off and isolating the output node from ground. The low voltage applied to the gate of transistor 73 will turn the transistor on, thereby pulling the $V_{pp}$ output node at its drain up to the power supply voltage level at its source. In this manner, the $V_{pp}$ control circuit of FIG. 7 will raise the $V_{pp}$ supply voltage up to a value that is within the normal write and erase operational range of $V_{pp}$. The protection circuitry coupled to the $V_{pp}$ voltage supply input pin of the memory, upon determining that $V_{pp}$ is within this normal operational range, will not be engaged thereby allowing peripheral devices, such as processor 23, to successfully execute write and erase operations to the memory.

When LOCKALL# is initiated, the signal is asserted to a low voltage value, this low voltage will be apply to the gate of transistor 72 turning it off. Turning off transistor 72 effectively raises the resistance between the source and drain of transistor 72 to well above the 10KΩ value of resistor 71, thereby lessening the voltage drop of the power supply across resistor 71. This will raise the voltage applied to the gate of transistor 73, pulling the gate up to a high voltage value that will turn off transistor 73. Meanwhile, the low voltage of LOCKALL# will be inverted by inverter 75, thereby applying a high voltage to the gate of transistor 74, turning it on. By turning off transistor 73 and turning on transistor 74 in this manner, the voltage division of the power supply voltage done by the relative source to drain resistances of transistors 73 and 74 will pull the $V_{pp}$ output node down to ground.

Therefore, the $V_{pp}$ control circuit of FIG. 7, in response to the LOCKALL# signal asserted at a low voltage, will lower its $V_{pp}$ output voltage. As shown in the computer system block diagram of FIG. 2, lowering the $V_{pp}$ output voltage of $V_{pp}$ control circuitry 20 will lower the voltage across supply line 25 coupled to a $V_{pp}$ voltage supply input pin of flash memory 22. Once protection circuitry 21 within the memory registers that $V_{pp}$ has fallen below the lockout voltage $V_{pplk}$, the protection circuitry will be engaged, thereby locking out write and erase operations to the memory. In doing so, the data stored in flash memory 22 is protected by preventing inadvertent write and erase operations to the memory by, for example, processor 23.

Proper selection of the p-channel "pull-up" transistors 53, 63 and 73 of the $V_{pp}$ control circuit portions shown in FIGS. 5, 6 and 7, respectively, is important for a proper control of $V_{pp}$. In particular, when the p-channel transistor is turned on, pulling $V_{pp}$ up towards the power supply voltage, the p-channel transistor must be able to drive $V_{pp}$ within the relatively narrow write and erase operational range between $V_{pphmin}$ and $V_{pphmax}$. This is accomplished by selecting a p-channel transistor satisfying the necessary source to drain resistance requirements in conduction (or "on") mode.

For example, for a 12 volt $V_{pp}$ supply, $V_{pphmin}$ is 12 volts minus 5% of 12 volts, which is 11.4 volts. Assuming a 12 volt power supply is implemented having a tolerance of 3%. The minimum power supply voltage will be 12 volts minus 3% of 12 volts, which is 11.64 volts. Therefore, the $V_{pp}$ pull-up transistor, its source being coupled to the power supply and its drain being coupled to the $V_{pp}$ output node, must not drop the power supply voltage below the $V_{pphmin}$ value of 11.4 volts given a minimum power supply voltage of 11.64 volts. In other words, the source to drain resistance across the p-channel transistor, while the transistor is turned on, must be low enough to limit the voltage drop between the power supply and $V_{pp}$ to 0.24 volts. Assuming a maximum current of 30 mA is drawn during a write or erase operation in the memory to which $V_{pp}$ is supplied, and using Ohm's Law, the source to drain resistance of the p-channel transistor can be calculated as 0.24 V divided by 30 mA or 8Ω. Therefore, selecting a p-channel transistor having a source to drain resistance of 8Ω or less, will supply the necessary $V_{pp}$ voltage required under these conditions.

A similar calculation can be done to determine the source to drain resistance of a p-channel transistor through which a 5 volt $V_{pp}$ supply is driven. For this embodiment, $V_{pphmin}$ is 5 volts minus 10% of 5 volts or 4.5 volts. The minimum voltage supplied by a 5 volt power supply having a 3% output tolerance is 4.85 volts. Therefore, to insure that the $V_{pp}$ output voltage does not fall below $V_{pphmin}$, a p-channel transistor having a source to drain voltage drop of less than 0.35 volts (4.85 volts minus 4.5 volts) is to be selected. Again, assuming a maximum current of 30 mA is drawn from the power supply during a write or erase operation, and using Ohm's Law, it is calculated that a p-channel transistor having a source to drain resistance of 11.7 Ohms or less, is to be selected.

A slight modification to the calculations described above may be necessary to implement the circuit shown in FIG. 6, due to the fact that the current drawn from the power supply while transistor 63 is turned on is slightly increased through the use of "pull-down" resistor 64. By assuming a slightly higher maximum current draw from the power supply of FIG. 6 when transistor 63 is turned on, an appropriate p-channel transistor can be selected. It can be calculated that to account for the additional current drawn by resistor 64, a p-channel transistor 63 having a slightly lower source to drain resistance is to be selected in comparison to, for example, the source to drain resistance value of p-channel transistor 53 in accordance with the embodiment of FIG. 5. In addition, in accordance with the embodiment of FIG. 6, a power supply should be selected that ensures that the maximum current demand of the memory to which the $V_{pp}$ output is coupled, as well as the current through resistor 64, can be adequately supplied.

For an alternate embodiment of the present invention, the $V_{pp}$ output of a $V_{pp}$ control circuit is capacitively coupled to ground through a relatively large capacitor. This embodiment is found useful for applications in which noise on the $V_{pp}$ voltage supply line is to be reduced. In addition, for another embodiment, the $V_{pp}$ voltage supply input pin of the memory to which the $V_{pp}$ output of the $V_{pp}$ control circuitry is coupled supports write and erase operations to only a portion of the total memory array within the memory. This embodiment is useful for selectively locking out only a portion of the memory array in response to a LOCKALL# value while allowing write and erase operations to another portion of the memory array. Also, although figures and embodiments have been described in reference to the flash memory 22 of FIG. 2, other nonvolatile memories having separate voltage supply input pins that support write and erase operations separately from read operations are used in accordance with alternate embodiments of the present invention.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for protecting data stored in a nonvolatile memory, the method comprising the steps of:

initiating a locking signal, the locking signal indicating that write and erase operations in at least a first portion of the memory are to be prevented;

lowering a supply voltage to the memory below a threshold value in response to the locking signal, the supply voltage supporting write and erase operations in the first portion of the memory; and engaging protection circuitry internal to the memory in response to lowering the supply voltage to the memory below the threshold value, thereby preventing write and erase operations in the first portion of the memory.

2. The method of claim 1, wherein the method is carried out in a computer system and the locking signal is initiated during steady-state operation of the computer system.

3. The method of claim 1, wherein the memory is a flash memory.

4. The method of claim 3, wherein the supply voltage to the memory is coupled to at least one voltage supply input pin of the flash memory.

5. The method of claim 4, wherein the threshold value is the lockout voltage of the flash memory.

6. The method of claim 4, wherein the voltage supply input pin is $V_{pp}$.

7. The method of claim 1, wherein lowering the supply voltage to the memory in response to the locking signal is done by a control circuit, the control circuit comprising discrete components on a printed circuit board.

8. The method of claim 1, wherein lowering the supply voltage to the memory in response to the locking signal is done by turning off a p-channel transistor comprising a gate, source, and drain, the gate of the p-channel transistor being controlled by the locking signal, the source of the p-channel transistor being coupled to a power supply, and the drain of the p-channel transistor being coupled to at least one voltage supply input pin of the memory as well as a drain of an n-channel transistor.

9. The method of claim 1, wherein lowering the supply voltage to the memory in response to the locking signal is done by turning off a p-channel transistor comprising a gate, source, and drain, the gate of the p-channel transistor being controlled by the locking signal, the source of the p-channel transistor being coupled to a power supply, and the drain of the p-channel transistor being coupled to at least one voltage supply input pin of the memory as well as a resistor.

10. A method for protecting data stored in a flash memory, the method comprising the steps of:

initiating a locking signal in a computer system during steady-state operation of the computer system, the locking signal indicating that write and erase operations in at least a first portion of the flash memory are to be prevented;

lowering an external supply voltage coupled to at least one voltage supply input pin of the flash memory below a threshold value in response to the locking signal, the supply voltage supporting write and erase operations in the first portion of the flash memory; and engaging protection circuitry internal to the flash memory in response to lowering the supply voltage external to the flash memory below the threshold value, thereby preventing write and erase operations in the first portion of the flash memory.

11. The method of claim 10, wherein the threshold value is the lockout voltage of the flash memory.

12. The method of claim 9, wherein the voltage supply input pin of the flash memory is $V_{pp}$, and lowering the supply voltage external to the flash memory in response to the locking signal is done by a control circuit, the control circuit comprising discrete components on a printed circuit board.

13. The method of claim 12, wherein lowering the supply voltage external to the memory in response to the locking signal is done by turning off a discrete p-channel transistor comprising a gate, source, and drain, the gate of the p-channel transistor being controlled by the locking signal, the source of the p-channel transistor being coupled to a power supply, and the drain of the p-channel transistor being coupled to the voltage supply input pin of the flash memory as well as a drain of a discrete n-channel transistor having its source coupled to ground.

14. The method of claim 12, wherein lowering the supply voltage external to the memory in response to the locking signal is done by turning off a discrete p-channel transistor comprising a gate, source, and drain, the gate of the p-channel transistor being controlled by the locking signal, the source of the p-channel transistor being coupled to a power supply, and the drain of the p-channel transistor being coupled to the voltage supply input pin of the flash memory as well as a resistor that is coupled to ground.

15. A computer system, comprising:
- a flash memory having a voltage supply input pin, the voltage supply input pin receiving a voltage that supports write and erase operations in a first portion of the flash memory;
- a protection circuit internal to the flash memory, coupled to the voltage supply input pin, that prevents write and erase operations in the first portion of the flash memory when the voltage received over the voltage supply input pin falls below a threshold value; and
- a control circuit external to the flash memory, coupled to the voltage supply input pin, that, in response to a locking signal, lowers the voltage to the voltage supply input pin below the threshold value during steady-state operation of the computer system, thereby preventing write and erase operations in the first portion of the flash memory.

16. The computer system of claim 15, wherein the threshold value is the lockout voltage of the flash memory.

17. The computer system of claim 15, wherein the voltage supply input pin is $V_{pp}$.

18. The computer system of claim 15, wherein the control circuit comprises discrete components on a printed circuit board.

19. The computer system of claim 15, wherein the control circuit comprises a p-channel and n-channel transistor, each having a gate, a source, and a drain, the gates of both the p-channel and n-channel transistors being controlled by the locking signal, the source of the p-channel transistor being coupled to a power supply, the drain of the p-channel transistor being coupled to the voltage supply input pin of the flash memory as well as the drain of the n-channel transistor, and the source of the n-channel transistor being coupled to ground.

20. The computer system of claim 15, wherein the control circuit comprises a p-channel transistor having a gate, source, and drain, the gate of the p-channel transistor being controlled by the locking signal, the source of the p-channel transistor being coupled to a power supply, the drain of the p-channel transistor being coupled to the voltage supply input pin of the flash memory as well as a resistor, the resistor being coupled to ground.

* * * * *